United States Patent
Lavoie et al.

(10) Patent No.: US 6,611,772 B1
(45) Date of Patent: *Aug. 26, 2003

(54) ELECTRONIC ELECTRICITY METER CONFIGURABLE TO OPERATE IN A PLURALITY OF METER FORMS AND RATINGS

(75) Inventors: Gregory P. Lavoie, Rochester, NH (US); David D. Elmore, Somersworth, NH (US); Larry A. Schmidt, Rochester, NH (US); Donald F. Bullock, Madbury, NH (US); Leslie Rosenau, Dover, NH (US)

(73) Assignee: General Electric Company, Plainville, CT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/857,322

(22) Filed: May 16, 1997

(51) Int. Cl.[7] .............................................. G06F 19/00

(52) U.S. Cl. .............................. 702/61; 702/60; 702/62

(58) Field of Search ............................... 702/61, 72, 77, 702/57, 65, 76, 109, 60, 189, 117, 62; 324/76.77, 86, 141, 76.11, 142, 76.21, 115–116

(56) References Cited

U.S. PATENT DOCUMENTS

| | | | | |
|---|---|---|---|---|
| 4,754,368 | A | | 6/1988 | Bullock et al. ............. 361/668 |
| 4,884,021 | A | | 11/1989 | Hammond et al. .......... 702/61 |
| 5,059,896 | A | * | 10/1991 | Germer et al. .............. 324/142 |
| 5,153,837 | A | * | 10/1992 | Shaffer et al. .............. 705/412 |

(List continued on next page.)

FOREIGN PATENT DOCUMENTS

| | | | | |
|---|---|---|---|---|
| CA | 2299002 A1 | * | 2/2001 | ........... G01R/22/00 |
| CA | 2299043 A1 | * | 2/2001 | ........... G01R/22/00 |
| CN | 1305316 A | * | 7/2001 | ............ H04Q/7/12 |
| CN | 1305317 A | * | 7/2001 | ............ H04Q/7/12 |
| CN | 1337805 A | * | 2/2002 | ........... H04L/12/28 |
| WO | 98/09555 | | 11/1998 | |

OTHER PUBLICATIONS

Schwendtner, "Technological developments in electricity metering and associated fields", from IEE, Metering and Tariffs for enegy supply 8th Inter. conf. publication No. 426, pp. 240–242, 1996.*

(List continued on next page.)

*Primary Examiner*—Cuong Nguyen
(74) *Attorney, Agent, or Firm*—Karl A. Vick; Armstrong Teasdale LLP

(57) ABSTRACT

An electricity meter which, in one embodiment, includes a digital signal processor configurable for generating energy measurements for a plurality of meter form types and connections is described. In the one embodiment, the meter includes voltage and current sensor for generating signals representative of current and voltage at a load, and the digital signal processor (DSP) is coupled to the voltage and current sensors. The DSP includes a memory, and a plurality of selectable instruction sets corresponding to respective meter form types are stored in the DSP memory. The form types includes meter ANSI form 9 and meter ANSI form 16 type forms, and the instruction sets include processing steps to be executed to determine line voltages and line currents for respective meter form types. The meter also includes a microcomputer coupled to the DSP for receiving data generated by the DSP. The microcomputer is operable transmit a selection command to the DSP to control selection of one of the instruction sets stored in the DSP memory. An optical port may be electrically coupled to the microcomputer, and the microcomputer is configured to receive a control command from the optical port. The microcomputer uses the control command to generate the selection command.

19 Claims, 6 Drawing Sheets

| DSP CASE # | METER APPLICATION | DSP INPUT SIGNALS | ANSI FORMS | SYMM-ETRICAL | PROCESSING STEPS |
|---|---|---|---|---|---|
| 0 | 2-ELEMENT, 3-WIRE METER 3-PHASE, 3-WIRE DELTA SERVICE | Va,Ia,Vc,Ic | 12S 45S | YES | Vb ⇐ -1/3 (Va + Vc) Va ⇐ Vb + Va Vc ⇐ Vb + Vc Ib ⇐ -(Ia + Ic) |
| 1 | 1-ELEMENT, 3-WIRE METER 1-PHASE, 3-WIRE SERVICE | Va,Ia,Ic | 2S | YES | Vc ⇐ -Va/2 Va ⇐ Va + Vc Vb ⇐ 0, Ib ⇐ 0 |
| 2 | 2-1/2 ELEMENT, 4-WIRE METER 3-PHASE, 4-WIRE WYE SERVICE | Va,Ia,Ib,Vc,Ic (Vb ABSENT) | 36S | YES | Vb ⇐ -(Va + Vc) |
| 3 | 2-ELEMENT, 3-WIRE METER 3-PHASE, 4-WIRE DELTA SERVICE 1-PHASE, 3-WIRE SERVICE, 3-PHASE, 4-WIRE WYE SERVICE | Va,Ia,Vb,Vc,Ic | 45S | NO YES YES | Va ⇐ Va - Vb Vb ⇐ 0, Ib ⇐ 0 |
| 4 | 2-ELEMENT, 3-WIRE METER 1-PHASE, 3-WIRE SERVICE, NETWORK SERVICE | Va,Ia,Vc,Ic | 12S | YES NO | Vb ⇐ 0, Ib ⇐ 0 |
| 5 | 1-ELEMENT, 2-WIRE METER 1-PHASE, 2-WIRE SERVICE | Va,Ia | 3S | | Vb ⇐ 0, Vc ⇐ 0, Ib ⇐ 0, Ic ⇐ 0 |
| 6 | 3-ELEMENT, 4-WIRE METER 3-PHASE/4-WIRE (WYE) 3-PHASE, 4-WIRE DELTA SERVICE | Va,Ia,Vb,Ib,Vc,Ic | 9S 16S | YES NO | NONE |

U.S. PATENT DOCUMENTS

| | | | |
|---|---|---|---|
| 5,325,051 A | * 6/1994 | Germer et al. | |
| 5,548,527 A | * 8/1996 | Hemminger et al. | 702/62 |
| 5,555,508 A |   9/1996 | Munday et al. | 705/410 |
| 5,631,554 A | * 5/1997 | Briese et al. | 324/76.77 |
| 5,644,222 A | * 7/1997 | Dohmstreich et al. | |
| 5,715,390 A | * 2/1998 | Hoffman et al. | 702/57 |
| 5,742,512 A | * 4/1998 | Edge et al. | 702/57 |

OTHER PUBLICATIONS

Changtao et al., "A New type intelligent multi–user single phase KWh meter", from Industrial Electronics, Proceedings of the IEEE Inter. Symposium, pp. 551–554 vol. 2, 1992.*

Motter et al., "Validation of end–use load data from direct metering projects", IEEE computer applications in power, vol. 1, issue 3, pp. 33–36, Jul. 1988.*

Jacobsen, "Experiences from testing of functionality and software of meters for energy", Metering and tariffs for energy supply, 9th Inter. conf. publication. No. 462, pp. 146–150, 1999.*

Eto et al., "Metered residential cooling loads: comparison of three models", from IEEE Transactions on power systems, vol. 12, issue 2, pp. 858–868, May 1997.*

Schwerndtner, "Digital measurement system for electricity meters", from metering and tariffs for energy supply, 8th Inter. conf. publ. No. 426, pp. 190–1993.*

\* cited by examiner

| | | |
|---|---|---|
| 9 | MO 45–0 | $e_A = [2(e_1 - e_0) - (e_3 - e_0)]/3$, $e_B = -[(e_1 - e_0) + (e_3 - e_0)]/3$, |
| 16 | MO 12–0 | $e_C = [2(e_3 - e_0) - (e_1 - e_0)]/3$, $i_B = -(i_A + i_C)$ |
| 9&16 | MO 2–1 | $e_A = (e_1 - e_0)/2$, $e_B = 0$, $e_C = (e_0 - e_1)/2$, $i_B = 0$ |
| 9 | MO 36–2 | $e_A = e_1 - e_0$, $e_B = -[(e_1 - e_0) + (e_3 - e_0)]$, $e_C = e_3 - e_0$ |
| 9 | MO 45–3 | $e_A = (e_1 - e_0) - (e_2 - e_0)$, $e_B = 0$, $e_C = e_3 - e_0$, $i_B = 0$ |
| 9&16 | MO 45&12–4 | $e_A = e_1 - e_0$, $e_B = 0$, $e_C = 0$, $i_B = 0$, $i_C = 0$ |
| 9&16 | MO 3–5 | $e_A = e_1 - e_0$, $e_B = e_2 - e_0$, $e_C = e_3 - e_0$ |
| 9&16 | MO 9&16–6 | |

| DSP CASE # | METER APPLICATION | DSP INPUT SIGNALS | ANSI FORMS | SYMMETRICAL | PROCESSING STEPS |
|---|---|---|---|---|---|
| 0 | 2-ELEMENT, 3-WIRE METER 3-PHASE, 3-WIRE DELTA SERVICE | Va,Ia,Vc,Ic | 12S 45S | YES | $Vb \Leftarrow -1/3\,(Va + Vc)$ $Va \Leftarrow Vb + Va$ $Vc \Leftarrow Vb + Vc$ $Ib \Leftarrow -(Ia + Ic)$ |
| 1 | 1-ELEMENT, 3-WIRE METER 1-PHASE, 3-WIRE SERVICE | Va,Ia,Ic | 2S | YES | $Vc \Leftarrow -Va/2$ $Va \Leftarrow Va + Vc$ $Vb \Leftarrow 0,\ Ib \Leftarrow 0$ |
| 2 | 2-1/2 ELEMENT, 4-WIRE METER 3-PHASE, 4-WIRE WYE SERVICE | Va,Ia,Ib,Vc,Ic (Vb ABSENT) | 36S | YES | $Vb \Leftarrow -(Va + Vc)$ |
| 3 | 2-ELEMENT, 3-WIRE METER 3-PHASE, 4-WIRE DELTA SERVICE 1-PHASE, 3-WIRE SERVICE, 3-PHASE, 4-WIRE WYE SERVICE | Va,Ia,Vb,Vc,Ic | 45S | NO YES YES | $Va \Leftarrow Va - Vb$ $Vb \Leftarrow 0,$ $Ib \Leftarrow 0$ |
| 4 | 2-ELEMENT, 3-WIRE METER 1-PHASE, 3-WIRE SERVICE, NETWORK SERVICE | Va,Ia,Vc,Ic | 12S | YES NO | $Vb \Leftarrow 0,\ Ib \Leftarrow 0$ |
| 5 | 1-ELEMENT, 2-WIRE METER 1-PHASE, 2-WIRE SERVICE | Va,Ia | 3S |  | $Vb \Leftarrow 0,\ Vc \Leftarrow 0,$ $Ib \Leftarrow 0,\ Ic \Leftarrow 0$ |
| 6 | 3-ELEMENT, 4-WIRE METER 3-PHASE/4-WIRE (WYE) 3-PHASE, 4-WIRE DELTA SERVICE | Va,Ia,Vb,Ib,Vc,Ic | 9S 16S | YES NO | NONE |

FIG. 5

ELECTRONIC ELECTRICITY METER CONFIGURABLE TO OPERATE IN A PLURALITY OF METER FORMS AND RATINGS

FIELD OF THE INVENTION

This invention relates generally to electricity metering and more particularly, to an electronic electricity meter configurable to operate in a plurality of meter forms and ratings.

BACKGROUND OF THE INVENTION

Since data collected from metering electric services within an electric distribution network is used for billing customers, the collected data must be accurate. To ensure accuracy, and in the past, different meter forms are used to meter energy consumption for different types of electric services and load ranges. Specifically, within an electric distribution network of a utility, there are many different services and loads which a utility desires to meter. Each type of service and load may require a meter having a particular "form" and "rating". The term "form" as used in the art refers to the physical configuration of an electrical service, and the term "rating" refers to both voltage and current range.

From application to application, the form and rating of the electricity meter required to accurately meter energy consumption may vary. Although broad current range and wide voltage range meters have reduced the number of different meter types required for such metering applications, meters having many different forms and ratings are still required by each utility.

Of course, requiring a utility to have on hand meters with a number of different forms and ratings results in increasing the costs associated with providing electric service. Particularly, different form and rated meters typically are stored in inventory so that when a metering application is identified which requires a particular form and rated meter, the meter is readily available and can be installed. In addition to the inventory costs, utility personnel must be trained on installation of each different form and rated meter. Of course, requiring skilled workers trained in the installation of a wide variety of meter types to install the meters also is costly.

It would be desirable to provide one meter capable of being used in a plurality of different applications requiring different forms and ratings to facilitate reducing the inventory and labor costs associated with metering a wide variety of electrical services. It also would be desirable to provide such a meter which does not adversely impact the accuracy of the energy measurements made.

SUMMARY OF THE INVENTION

These and other objects may be attained by an electricity meter which, in one embodiment, a digital signal processor configurable for generating energy measurements for a plurality of meter form types and connections. More particularly, and in the one embodiment, the meter includes voltage and current sensor for generating signals representative of current and voltage at a load, and the digital signal processor (DSP) is coupled to the voltage and current sensors. The DSP includes a memory, and a plurality of selectable instruction sets corresponding to respective meter form types are stored in the DSP memory. The form types includes meter ANSI form 9 and meter ANSI form 16 type forms, and the instruction sets include processing steps to be executed to determine line voltages and line currents for respective meter form types.

The meter also includes a microcomputer coupled to the DSP for receiving data generated by the DSP. The microcomputer is operable to transmit a selection command to the DSP to control selection of one of the instruction sets stored in the DSP memory. An optical port may be electrically coupled to the microcomputer; and the microcomputer is configured to receive a control command from the optical port. The microcomputer uses the control command to generate the selection command.

When fabricating the above described meter, a meter base is selected to at the factory. As is known in the art, and by way of example with respect to meter socket types, the meter base configuration may conform to the ANSI 9S socket configuration or the ANSI 16S socket configuration. With respect to bottom connected meter types, the meter base configuration may conform to ANSI 10A, 48A or 16A configurations. Depending on the meter base configuration, the DSP memory is then loaded with instruction sets for all possible applications for that particular base. For example, a meter having a base, which conforms to an ANSI 9S socket, may have a 3 element, a 2½ element, a 2 element, or a 1 element connection between the meter and the power lines. In addition, and for each of the various number of elements, the specific electric circuit to which meter is actually is used depends upon the electric service, e.g., an ANSI 9S form may be electrically connected to a 4W-Y electrical connection, a 4W-Δ electrical connection, a 3W-Δ electrical connection, a 3W-1Φ electrical connection, and a 2W-1Φ electrical connection. Alternatively, the electric meter may be connected to an ANSI 16S form electric service, where the three element connection may be electrically connected to a 4W-Y electrical connection, a 4W-Δ electrical connection, a 3W-Δ electrical connection, a 3W-Network electrical connection, a 3W-1Φ electrical connection, and a 2W-1Φ electrical connection. All the instruction sets for the various meter forms reside in the DSP ROM memory, and the instruction sets contain the process steps to be executed for each of the possible applications for the particular meter base. The meter is preprogrammed at the factory so that the most commonly used instruction set for the meter base is selected for execution by the DSP, and the meter is then delivered to the utility.

At the utility, and for an ANSI 9S base meter for example, a worker may install the meter in any ANSI 9S socket. If the electric connection between the meter and the power lines at that particular installation correspond to the preprogrammed selected instruction set, then the worker need not take any further action with respect to proper installation. If the particular installation does not correspond to the preprogrammed selected instruction sets, the worker may then select the appropriate instruction set or sets by transmitting a select signal to the microcomputer via the optical port. The microcomputer then transmits the command signal to the DSP instructing the DSP to execute a particular preloaded instruction set corresponding the electric circuit at the installation.

With the above described meter configuration, and rather than requiring a utility to store many different meters in inventory, only two sets of meters need be on hand for socket based applications, for example. These meters are readily and easily configurable so that accurate metering is performed at each installation.

BRIEF DESCRIPTION OF THE DRAWINGS

FIG. 4a is a matrix illustrating the processing steps executed by the digital signal processor for each of the various forms identified in FIG. 3, and FIGS. 4b and 4c illustrate various meter forms and designations referenced in the matrix shown in FIG. 4a.

FIG. 5 is a chart setting forth additional metering applications, digital signal processor input signals, form, and processing steps executed by the processor.

DETAILED DESCRIPTION

Figures 1, 3:
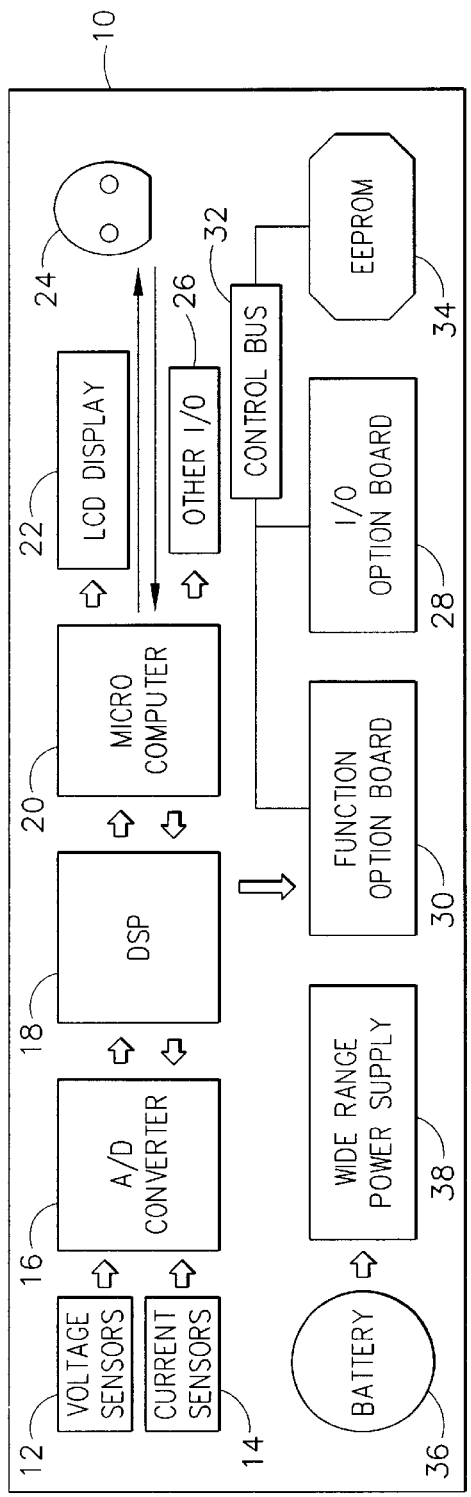
FIG. 1 is a block diagram of an electronic energy meter.
FIG. 3 is a chart illustrating the form, elements, and methods of operation for a variety of electricity services.

FIG. 1 is a block diagram illustration of an exemplary electronic energy meter 10 which, for example, is commercially available from General Electric Company, 130 Main Street, Somersworth, N.H. 03878, and generally referred to as the KV meter. The KV meter can be modified to be configurable as described below in more detail. Although the present apparatus and methods are described herein in the context of an electronic electricity meter, it should be understood that the present invention is not limited to practice with any one particular meter. The present invention can be utilized in connection with other microcomputer based meters.

Referring now specifically to FIG. 1, meter 10 includes voltage sensors 12 and current sensors 14. Sensors 12 and 14, in operation, typically are coupled to the power lines supplying power to site at which the meter is located. Sensors 12 and 14 are coupled to an analog to digital (A/D) converter 16 which converts the input analog voltage and current signal to digital signals. The output of converter 16 is provided to a digital signal processor (DSP) 18. DSP 18 supplies microcomputer 20 with digitized metering quantities, e.g., $V^2H$, $I^2H$. Microcomputer 20, using the metering quantities supplied by DSP 18, performs additional metering calculations and functions. DSP 18 may, for example, be a processor commercially available as Model Number TMS320 from Texas Instruments Company, P.O. Box 6102, Mail Station 3244, Temple, Tex. 76503, modified to perform metering functions.

Microcomputer 20 is coupled to a liquid crystal display 22 to control the display of various selected metering quantities and to an optical communications port 24 to enable an external reader to communicate with computer 20. Port 24 may be the well known OPTOCOM™ port of General Electric Company, 130 Main Street, Somersworth, N.H. 03878, which is in accordance with the ANSI type II optical port. Microcomputer 20 may also generate additional outputs 26 used for various other functions as is well known in the art. Microcomputer 20 may, for example, be an eight bit microcomputer commercially available from Hitachi America, Inc., Semiconductor & I.C. Division, Hitachi Plaza, 2000 Sierra Point Parkway, Brisbane, Calif. 94005-1819, modified to perform metering functions.

Microcomputer 20 also is coupled to an input/output (I/O) board 28 and to a function, or high function, board 30. DSP 18 also supplies outputs directly to high function board 30. Microcomputer 20 further is coupled, via a control bus 32, to an electronically erasable programmable read only memory (EEPROM) 34. I/O board 28 and high function board 30 also are coupled, via bus 32, to EEPROM 34.

Back-up power is supplied to the meter components described above by a battery 36 coupled to a wide range power supply 38. In normal operation when no back-up power is required, power is supplied to the meter components from the power lines via power supply 38.

Many functions and modifications of the components described above are well understood in the metering art. The present application is not directed to such understood and known functions and modifications. Rather, the present application is directed to the methods and apparatus for configuring a meter to be compatible with many different metering applications as described below in more detail. In addition, although the methods and apparatus are described below in the hardware environment shown in connection with FIG. 1, it should be understood that such methods and apparatus are not limited to practice in such environment. The subject methods and apparatus could be practiced in many other environments.

Further, it should be understood that the present invention can be practiced with many alternative microcomputers, and is not limited to practice in connection with just microcomputer 20. Therefore, and as used herein, the term microcomputer is not limited to mean just those integrated circuits referred to in the art as microcomputers, but broadly refers to microcomputers, processors, microcontrollers, application specific integrated circuits, and other programmable circuits.

Figure 2:
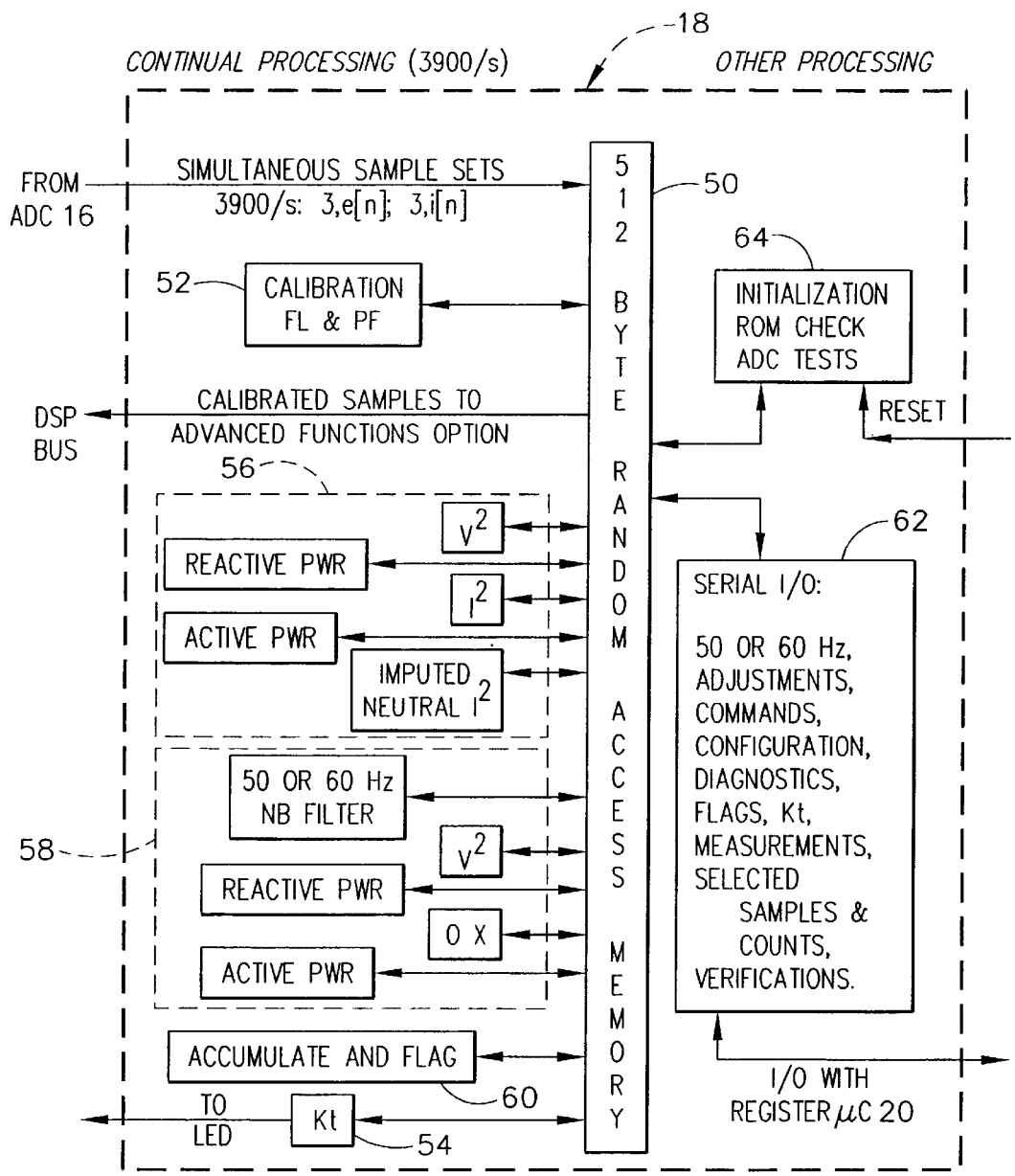
FIG. 2 is a block diagram illustration of the digital signal processor shown in FIG. 1.

FIG. 2 is a block diagram illustration of DSP 18 shown in FIG. 1. DSP 18 includes a random access memory (RAM) 50 illustrated as being a 512 byte RAM. Inputs to DSP 18 includes sample sets from A/D converter 16 which are transmitted from converter 16 to DSP 18 at 3900 bits per second in the specific configuration illustrated. The sample sets are at least temporarily stored in RAM 50 for further processing. DSP 18 also includes a read only memory (ROM), and a number of instructions (FL and PF) 52 and metering pulse instruction (Kt) 54, and instruction sets 56 and 58 are stored in the ROM. Block 56 describes the values calculated by DSP 18 as being $V^2$, Reactive Power, $I^2$, Active Power, and Imputed Neutral $I^2$, for fundamental and harmonics. Block 58 describes values calculated by DSP 18 for 50 or 60 Hz NB Filter, $V^2$, Reactive Power, zero crossing (0 X), and Active Power, for fundamental frequency only. The settings for various flags and accumulated values 60 also are stored in the ROM.

As described above, DSP 18 is configured to connect to microcomputer 20, and such connection is made via a serial input/output port 62. Various commands and data are passed between DSP 18 and microcomputer 20 via port 62, and such commands and data include adjustments for 50 Hz and 60 Hz operation, diagnostics, flags, metering constant (Kt), measurements, selected samples and counts, and verifications. These commands and data are stored at least temporarily in RAM 50 and are used to control processing by DSP 18. DSP 18 also includes a reset port 64, and when a reset signal is received at reset port 64, various checks are performed including ROM and analog-to-digital converter tests, as is known in the art.

DSP 18 is described herein as one exemplary embodiment of the environment in which the present invention can be practiced. It should be understood, therefore, that the present invention can be practiced in connection with many alternative types of processors and in other meter configurations.

Generally, and with respect to operation of DSP 18, instruction sets include processing steps to be executed to determine line voltages and line currents for respective meter form types are stored in the DSP memory, or ROM. Microcomputer 20 is operable to transmit a selection command to DSP 18 to control selection of one of the instruction sets stored in the DSP memory. Particularly, microcomputer 20 is configured to receive a control command via optical port 24, and microcomputer 20 uses the control command to generate the selection command. DSP 18 then processes the data received from ADC 16 in accordance with the selected instruction set, and the calculated values are provided to microcomputer 20 via serial I/O 62. In addition, DSP 18 can be programmed to calibrate the samples received from ADC 16, and such calibrated samples can be provided to other meter circuitry via a DSP bus.

With respect to function blocks 56 and 58, the underlying process steps executed by DSP 18 to make calculations such as reactive power and active power are dependent upon the meter form and the electrical circuit in which the meter is connected. More particularly, and referring to FIG. 3, the meter form types includes meter ANSI form 9 and meter ANSI form 16 type forms, the number of elements may be 3, 2, 2½, or 1, and there are a number of circuit configurations in which the meter can be connected. The meter form, elements, and circuit configurations affect the inputs received by the DSP and the meter operation. The meter method of operation (MO) designations in accordance with ANSI standards are set forth in FIG. 3.

Figures 4A, 4B, 4C:
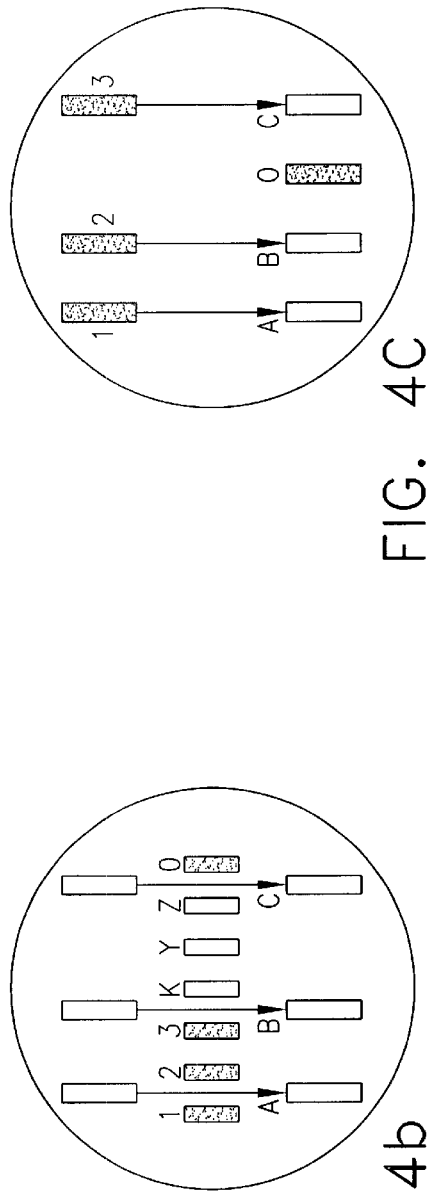

FIG. 4a illustrates the processing steps executed by DSP 18 for each of the various forms and meter operation (MO) designations identified in FIG. 3. The designations set forth in FIG. 4a correspond to the meter base forms illustrated in FIGS. 4b and 4c. Particularly, FIG. 4b is a form 9S meter base and FIG. 4c is a from 16S meter base. Each voltage is the potential difference between the voltage sensing blades which are illustrated as solid rectangles in FIGS. 4b and 4c. Each voltage sensing blade is assigned a number, i.e., 0, 1, 2, 3. Each current is sensed in a conductive circuit between two blades, illustrated in FIGS. 4b and 4c as a line between blades. The current sensing blades are illustrated as outlined rectangles. Each current is designated as a letter A, B, or C. Some socket type meters have blades which are utilized for both voltage sensing and current sensing. This circumstance is illustrated in FIGS. 4b and 4c with one blade (e.g., an upper blade) illustrated as a voltage sensing blade with a number (e.g., 1, 2, or 3) next to it and a lower blade illustrated as a current sensing blade.

Referring now to FIGS. 4a, 4b, and 4c, the values $e_0$, $e_1$, $e_2$, and $e_3$ represent the voltage signal values obtained from respective voltage sensing blades of the meter base and provided to DSP 18 via ADC 16. The values $e_A$, $e_B$, and $e_C$ are the calculated voltage values for the respective lines, and the values $i_A$, $i_B$, and $i_C$ are the calculated current values for the respective lines. Using the voltage values, instantaneous power can be calculated in accordance with the following.

$$p_A = e_A \times i_A,$$

$$p_B = e_B \times i_B,$$

$$p_C = e_C \times i_C, \text{ and}$$

$$p_{TOTAL} = p_A + p_B + p_C.$$

As set forth in FIG. 3, the calculations for each the various voltage and current values may vary depending on the meter form and meter operation.

FIG. 5 is a chart setting forth in more detail the DSP processing steps for each type of meter service application.

The DSP Case # column refers to the general designation which may be assigned to each meter application. The DSP Case # could be used, for example, by microcomputer 20 to communicate to DSP 18 the particular type of service being metered so that DSP 18 executes the appropriate steps in calculating the various metering quantities. More particularly, and in one specific embodiment, the DSP Case # is passed to DSP 18 from microcomputer 20 in a configuration word (CFG_WRD).

The Meter Application column identifies the specific electric circuit being metered. For example, for DSP Case #0, the specific meter being used is a 2-element, 3-wire meter in a 3-phase, 3-wire delta service. The DSP input signals column identifies the signals provided to DSP 18 from ADC 16. The ANSI forms column identifies the particular ANSI form corresponding to the particular service. The Symmetrical column identifies whether the attributes of symmetry (i.e., whether arithmetic apparent power is defined) are present.

The Processing Steps column identifies the processing carried out by DSP 18 to calculate various metering quantities for each DSP Case #. Execution of the steps shown in FIG. 5 for each case are to be carried out from top to bottom, and the processing is performed on corrected samples to transform a wide variety of forms and services into a virtual 4-wire wye configuration.

Of course, the present invention is not limited to the specific processing steps illustrated in FIG. 5, and it is possible to use other processing steps even for the same meter applications depending on the standard calculation methodology selected. For example, in the processing illustrated in FIG. 5 and as explained above, the processing is performed to transform a wide variety of forms and services into a virtual 4-wire wye configuration. Of course, in making this transformation, some of the phases do not actually exist and are processed as phantom phases. Alternatively, the processing could be carried out to transform the data to some other virtual meter configuration.

FIGS. 6a–i illustrate electrical connections made for various forms and applications. Generally, using the present invention, two meter forms satisfy all electrical services requiring three or fewer meter elements. Particularly, with class 20 and class 200 meter forms rated at 57 to 120 volts, and 120 to 480 volts accommodating 528 volts continuously and 575 volts maximum, such service needs can be met with just two meter forms. In addition, with an extended class 320 rated meter, load currents up to 320 amperes directly can be metered. Using a form 9S, class 20 meter with instrument transformers, larger loads and higher voltages can be measured.

Figure 6C:
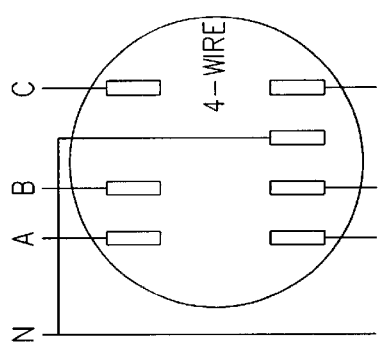
FIGS. 6a–i illustrate electrical connections made for various forms and applications.
Figure 6B:
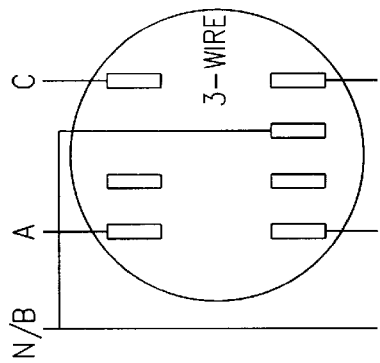
Figure 6A:
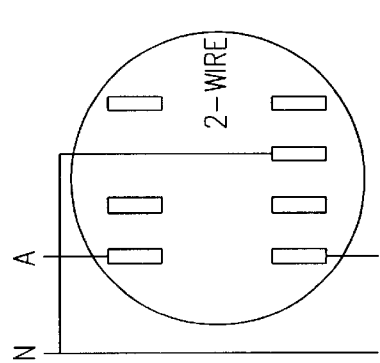
Figure 6F:
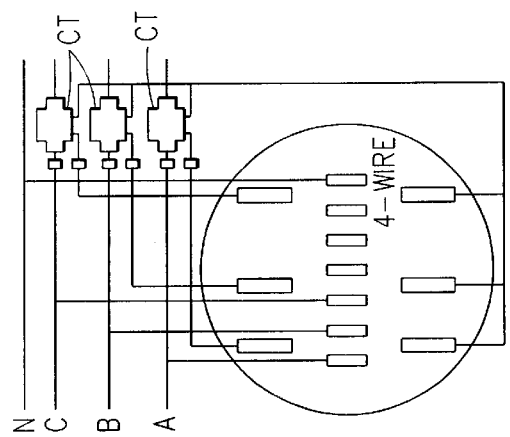
Figure 6E:
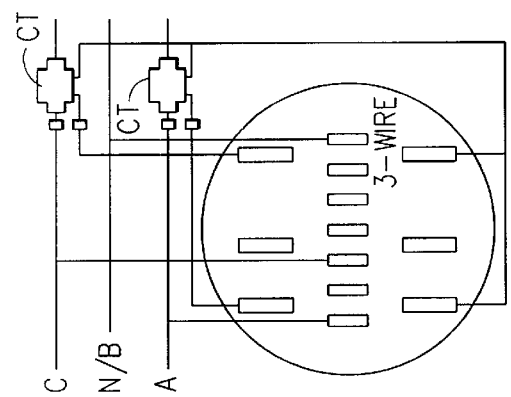
Figure 6D:
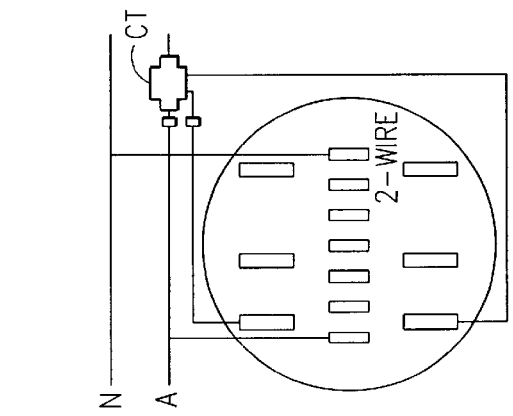
Figure 6I:
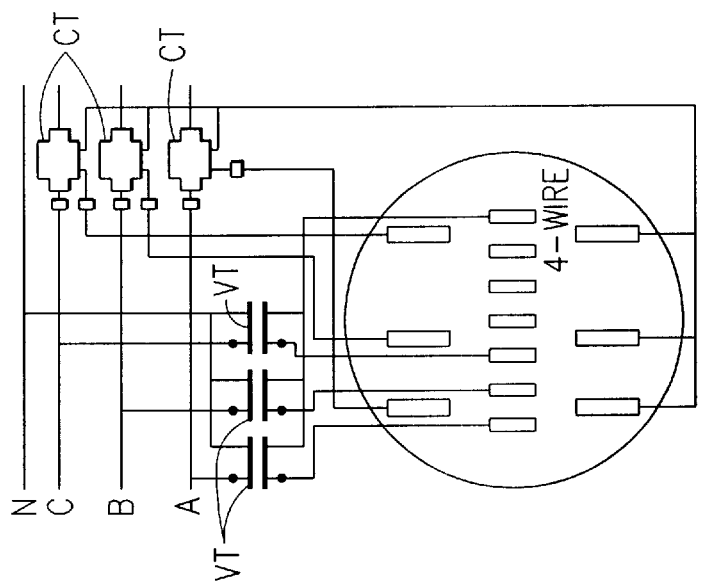
Figure 6H:
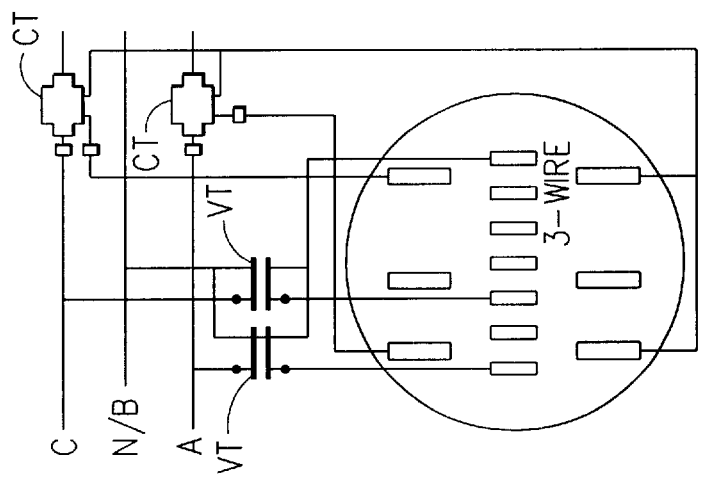
Figure 6G:
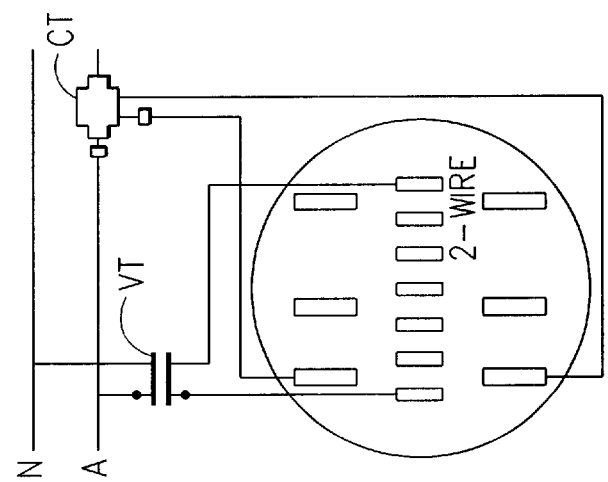

More particularly, and referring to FIGS. 6a–i, the form designations are set forth in accordance with ANSI C12.10 form designations. FIGS. 6a–c illustrate self-contained, form 16S meter bases with the following ratings: Kh 21.6, Kt 4.5, and CL 320. FIG. 6a is a 2-wire base, FIG. 6b is a 3-wire base, and FIG. 6c is a 4-wire base. FIGS. 6d–i illustrate transformer rated, form 9S meter bases with the following ratings: Kh 1.8, Kt 0.3, and CL 20. Current transformers are identified by the designation "CT" and voltage transformers are identified by the designation "VT". The meter base connections illustrated in FIGS. 6d–f include current transformer(s) (CT) only, and the meter base connections illustrated in FIGS. 6g–i include current transformer(s) (CT) and voltage transformer(s) (VT).

When fabricating the above described meter including DSP 18, a meter base is selected at the factory. As is known in the art, and by way of example with respect to meter socket types, the meter base configuration may conform to the ANSI 9S socket configuration or the ANSI 16S socket configuration. Depending on the meter base configuration, the DSP memory is then loaded with instruction sets for all possible applications for that particular base. For example, a meter having a base which conforms to an ANSI 9S socket may have a 3 element, a 2½ element, a 2 element, or a 1 element connection between the meter and the power lines. In addition, and for each of the various number of elements, the specific electric circuit to which meter is actually is used depends upon the electric service, e.g., an ANSI 9S form, 3element connection may be electrically connected to a 4W-Y configuration or a 4W-delta configuration. The instructions sets which reside in the DSP memory contain the process steps to be executed for each of the possible applications for the particular meter base. The meter is preprogrammed at the factory so that the most commonly used instruction set for the meter base is selected for execution by the DSP, and the meter is then delivered to the utility.

At the utility, and for an ANSI 9S base meter for example, a worker may install the meter in any ANSI 9S socket. If the electric connection between the meter and the power lines at that particular installation correspond to the preprogrammed selected instruction set, then the worker need not take any further action with respect to proper installation. If the particular installation does not correspond to the preprogrammed selected instruction set, the worker may then select the appropriate instruction set by transmitting a select signal to the microcomputer via the optical port. The microcomputer then transmits the command signal to the DSP instructing the DSP to execute a particular preloaded instruction set corresponding the electric circuit at the installation.

With the above described meter configuration, and rather than requiring a utility to store many different meters in inventory, only two sets of meters need be on hand for socket based applications, for example. These meters are readily and easily configurable so that accurate metering is performed at each installation.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation. For example, it is contemplated that the DSP could be automatically configured for a particular service rather than requiring a user to select the DSP Case Number. Particularly, depending on the particular service and using predetermined criteria, the microcomputer could automatically determine the type of service being metered and then instruct the DSP to execute the appropriate instruction sets. As an example, if DSP Case Number 3 is selected for a form 45S, 2 element, 3 wire meter, several different services could be metered. Upon initiation of operation, the microcomputer may determine, using preprogrammed criteria, that DSP Case Number 0 is the correct case number, and the DSP would automatically be instructed by the microcomputer to execute the instruction sets for DSP Case Number 0. Accordingly, the spirit and scope of the invention are to be limited only by the terms of the appended claims.

What is claimed is:

1. An electricity meter for measuring energy consumption of a load and connectable to a plurality of electrical service types, comprising:

a meter base having a preselected form type configured to electrically connect to each of the electrical service types;

at least one of a voltage and a current sensor for generating signals representative of current and voltage at the load;

a digital signal processor coupled to said voltage and current sensors comprising a memory including a plurality of selectable instruction sets corresponding to said preselected meter base form type, said digital signal processor configured to select and execute at least one of said plurality of instruction sets based on the electrical service type to which said meter base is electrically connected;

a microcomputer coupled to said digital signal processor for receiving data therefrom; and an optical port electrically coupled to said microcomputer.

2. An electricity meter in accordance with claim 1 wherein said microcomputer is operable to transmit a selection command to said digital signal processor to control selection of one of said instruction sets stored in said digital signal processor memory.

3. An electricity meter in accordance with claim 2 wherein said microcomputer is configured to receive a control command from said optical port and using the control command, to generate the selection command.

4. An electricity meter in accordance with claim 1 wherein the preselected form type of said meter base includes one of a meter ANSI form 9 and a meter ANSI form 16.

5. An electricity meter in accordance with claim 4 wherein the instruction sets include processing steps to be executed to determine line voltages and line currents for the respective meter form.

6. An electricity meter in accordance with claim 4 wherein said ANSI form 9 meter base configured for electrical connection with the electrical service types including at least one of a 4W-Y electrical connection, a 4W-Δ electrical connection, a 3W-Δ electrical connection, a 3W-1Φ electrical connection, and a 2W-1Φ electrical connection.

7. An electricity meter in accordance with claim 4 wherein said ANSI form 16 meter base configured for electrical connection with the electrical service types including at least one of a one of a 4W-Y electrical connection, a 4W-Δ electrical connection, a 3W-Δ electrical connection, a 3W-Network electrical connection, a 3W-1Φ electrical connection, and a 2W-1Φ electrical connection.

8. A processor for an electricity meter, the meter including a base having a preselected form type connectable to a plurality of electrical service types, said processor comprising:

a memory including a plurality of selectable instruction sets corresponding to the preselected meter base form type; and a processing unit for performing energy consumption calculations, said processing unit configured to select at least one of said instruction sets such that upon execution of said instruction set the energy consumption calculations are performed within said electricity meter according to the electrical service type to which the meter base is electrically connected.

9. A processor in accordance with claim 8 wherein the preselected form of the meter base includes one of a meter ANSI form 9 and a meter ANSI form 16.

10. A processor in accordance with claim 9 wherein the instruction sets include processing steps to be executed to determine line voltages and line currents for the respective meter form.

11. A processor in accordance with claim 9 wherein said ANSI form 9 meter base configured for electrical connection with the electrical service types including at least one of a 4W-Y electrical connection, a 4W-Δ electrical connection, a 3W-Δ electrical connection, a 3W–1Φ electrical connection, and a 2W–1Φ electrical connection.

12. A processor in accordance with claim 9 wherein said ANSI form 16 meter base configured for electrical connection with the electrical service types including at least one of a 4W-Y electrical connection, a 4W-Δ electrical connection, a 3W-Δ electrical connection, a 3W-Network electrical connection, a 3W–1Φ electrical connection, and a 2W–1Φ electrical connection.

13. A processor in accordance with claim 8 comprising an input configured to be coupled to a microcomputer operable transmit a selection command to said digital signal processor to control selection of one of said instruction sets stored in said digital signal processor memory.

14. A method of operating an electricity meter for measuring energy consumption of a load and connectable to a plurality of electrical service types, the meter including a meter base having a preselected form type electrically connectable to each of the electrical service types, at least one of a voltage and a current sensor for generating signals representative of current and voltage at the load, a digital signal processor electrically coupled to the voltage and current sensors including a memory having stored therein a plurality of selectable instruction sets corresponding to the preselected meter base form type, a microcomputer coupled to the digital signal processor and an optical port electrically coupled to said microcomputer, said method comprising the steps of:

selecting at least one of the instructions sets based on the electrical service type to which the meter base is electrically connected; and executing the instructions contained in the selected instruction set.

15. A method in accordance with claim 14 wherein said step of selecting comprising the steps of:

receiving a control command at the microcomputer;

transmitting a selection command to the digital signal processor and;

controlling selection of one of the instruction sets stored in the digital signal processor memory using the selection command.

16. A method in accordance with claim 15 wherein the step of receiving a control command comprises the steps of:

receiving the control command from the optical port; and using the control command to generate the selection command.

17. A method in accordance with claim 14 wherein the preselected form type includes at least one of a meter ANSI form 9 and meter ANSI form 16, and the instruction sets include processing steps, said step of executing the instructions comprises the step of executing the processing steps to determine line voltages and line currents for the respective meter form.

18. A method in accordance with claim 10 wherein said ANSI form 16 meter base configured for electrical connection with the electrical service type including at least one of a 4W-Y electrical connection, a 4W-Δ electrical connection, a 3W-Δ electrical connection, a 3W-Network electrical connection, a 3W–1Φ electrical connection, and a 2W–1Φ electrical connection.

19. A method in accordance with claim 10 wherein said ANSI form 9 meter base configured for electrical connection with the electrical service type including at least one of a 4W-Y electrical connection, a 4W-Δ electrical connection, a 3W-Δ electrical connection, a 3W–1Φ electrical connection, a 2W–1Φ electrical connection.

* * * * *